(12) United States Patent
Hau-Riege et al.

(10) Patent No.: US 9,171,782 B2
(45) Date of Patent: Oct. 27, 2015

(54) STACKED REDISTRIBUTION LAYERS ON DIE

(71) Applicant: QUALCOMM Incorporated, San Diego, CA (US)

(72) Inventors: Christine Sung-An Hau-Riege, Fremont, CA (US); You-Wen Yau, San Diego, CA (US); Kevin Patrick Caffey, Cardiff by the Sea, CA (US); Lizabeth Ann Keser, San Diego, CA (US); Gene Hyde McAllister, La Mesa, CA (US); Reynante Tamunan Alvarado, San Diego, CA (US); Steve Joseph Bezuk, Poway, CA (US); Damion Bryan Gastelum, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

(21) Appl. No.: 13/960,110

(22) Filed: Aug. 6, 2013

(65) Prior Publication Data

US 2015/0041982 A1    Feb. 12, 2015

(51) Int. Cl.
| | |
|---|---|
| *H01L 27/118* | (2006.01) |
| *H01L 23/485* | (2006.01) |
| *H01L 21/768* | (2006.01) |
| *H01L 23/532* | (2006.01) |
| *H01L 23/525* | (2006.01) |

(52) U.S. Cl.
CPC ........ *H01L 23/485* (2013.01); *H01L 21/76841* (2013.01); *H01L 21/76895* (2013.01); *H01L 23/53238* (2013.01); *H01L 23/53266* (2013.01); *H01L 23/525* (2013.01); *H01L 2224/0231* (2013.01); *H01L 2224/0239* (2013.01); *H01L 2224/02331* (2013.01)

(58) Field of Classification Search
CPC ............ H01L 23/485; H01L 21/76841; H01L 21/76895
USPC .......................................................... 257/210
See application file for complete search history.

(56) References Cited

U.S. PATENT DOCUMENTS

| | | | |
|---|---|---|---|
| 6,924,558 B2 | 8/2005 | Hanaoka | |
| 7,445,958 B2 | 11/2008 | Suminoe et al. | |
| 7,446,422 B1 | 11/2008 | Paek et al. | |
| 7,808,105 B1 * | 10/2010 | Paek | 257/750 |
| 7,863,742 B2 | 1/2011 | Yu et al. | |
| 8,058,726 B1 | 11/2011 | Jin et al. | |

(Continued)

OTHER PUBLICATIONS

Partial International Search Report—PCT/US2014/048945—ISA/EPO—Oct. 30, 2014.

(Continued)

*Primary Examiner* — Nicholas Tobergte
(74) *Attorney, Agent, or Firm* — Loza & Loza, LLP

(57) ABSTRACT

Some implementations provide a semiconductor device (e.g., die) that includes a substrate, several metal layers and dielectric layers coupled to the substrate, a pad coupled to one of the plurality of metal layers, a first metal redistribution layer coupled to the pad, and a second metal redistribution layer coupled to the first metal redistribution layer. The second metal redistribution layer includes a cobalt tungsten phosphorous material. In some implementations, the first metal redistribution layer is a copper layer. In some implementations, the semiconductor device further includes a first underbump metallization (UBM) layer and a second underbump metallization (UBM) layer.

32 Claims, 12 Drawing Sheets

(56) References Cited

U.S. PATENT DOCUMENTS

| | | | |
|---|---|---|---|
| 8,659,144 B1* | 2/2014 | Sutardja | 257/691 |
| 2003/0134496 A1* | 7/2003 | Lee et al. | 438/612 |
| 2005/0160575 A1* | 7/2005 | Gambino et al. | 29/602.1 |
| 2007/0096313 A1 | 5/2007 | Chou et al. | |
| 2007/0166992 A1* | 7/2007 | Daubenspeck et al. | 438/613 |
| 2007/0222073 A1* | 9/2007 | Farooq et al. | 257/738 |
| 2009/0057844 A1 | 3/2009 | Tanida et al. | |
| 2009/0085152 A1* | 4/2009 | Bernstein et al. | 257/529 |
| 2009/0115058 A1* | 5/2009 | Yu et al. | 257/738 |
| 2010/0078819 A1 | 4/2010 | Shin et al. | |
| 2010/0099250 A1* | 4/2010 | Jang et al. | 438/614 |
| 2011/0101527 A1* | 5/2011 | Cheng et al. | 257/738 |
| 2012/0025383 A1 | 2/2012 | Daubenspeck et al. | |
| 2012/0043654 A1* | 2/2012 | Lu et al. | 257/737 |
| 2012/0248605 A1 | 10/2012 | Yamaguchi | |
| 2013/0026618 A1* | 1/2013 | Chen | 257/737 |
| 2013/0181338 A1* | 7/2013 | Lu et al. | 257/737 |
| 2014/0264824 A1* | 9/2014 | Lu et al. | 257/734 |
| 2015/0014851 A1* | 1/2015 | Lu et al. | 257/738 |
| 2015/0021758 A1* | 1/2015 | Tsai et al. | 257/737 |

OTHER PUBLICATIONS

Aubel, et al., "Comprehensive reliability analysis of CoWP Metal Cap unit processes for high volume production in sub-m dimensions," IEEE CFP08RPS-CDR 46th Annual International Reliability, Physics Symposium, pp. 675-pp. 676, Phoenix, 2008.

Bauer, et al., "Electromigration Behavior of Interconnects between Chip and Board for Embedded Wafer Level Ball Grid Array (eWLB)," 2011 Electronic Components and Technology Conference, pp. 317-pp. 325, 2011.

Frank, et al., "Electromigration degradation mechanism analysis of SnAgCu interconnects for eWLB package," IEEE, 978-1-4577-1680-5/12, pp. 2E51-p. 2E56, 2012.

Hau-Riege, et al., "Electromigration of Solder Balls for Wafer-Level Packaging with Different Under Bump Metallurgy and Redistribution Layer Thickness," Eelctronic Components & Technology Conference, p. 1-p. 7, 2013.

Hau-Riege, et al., "Electromigration Performance of Lead-Free Solder Balls for Surface-Mount Packaging Applications," Advanced Metallization Conference 2010, p. 1-p. 14, 2010.

Hau-Riege, et al., "Electromigration Studies of Lead-Free Solder Balls used for Wafer-Level Packaging," 2011 Electronic Components and Technology Conference, pp. 717-pp. 721, 2011.

Hu, et al., "Reduced electromigration of Cu wires by surface coating," Applied Physics Letters, 2002 American Institute of Physics, vol. 81, No. 10, pp. 1782-pp. 1784, Sep. 2, 2002.

Lai, et al., "Electromigration Reliability of Redistribution Lines in Wafer-level Chip-Scale Packages," 2011 Electronic Components and Technology Conference, pp. 326-pp. 331, 2011.

International Search Report and Written Opinion—PCT/US2014/048945—ISA/EPO—Dec. 18, 2014.

* cited by examiner

STACKED REDISTRIBUTION LAYERS ON DIE

BACKGROUND

1. Field

Various features relate to stacked redistribution layers on a die

2. Background

A die can be defective for many reasons. The process of manufacturing dies can cause cracking in dies, which can result in defective dies. In addition, dies can be defective or fail when they are subject to relative high operating current, which can cause fast electromigration (EM) degradation near the redistribution layer/ball region in a die.

FIG. 1 illustrates a side view of a die. Specifically, FIG. 1 illustrates a side view of a die 100 that includes a substrate 101, several metal and dielectric layers 102, a pad 104, a passivation layer 106, a first insulation layer 108, a metal redistribution layer (RDL) 110, and a second insulation layer 114. FIG. 1 also illustrates a solder ball 116 on the die 100. Specifically, the solder ball 116 is coupled to the metal redistribution layer 110. The pad 104 and the metal redistribution layer 110 are a conductive material. For example, the pad 104 may be an aluminum material and the metal redistribution layer 110 may be a copper material. The first insulation layer 108 and the second insulation layer 112 are polyimide layers.

Fast EM degradation may occur at a RDL/ball region of a die due to high current and rapid copper-tin (CuSn) intermetallic formation. An example of a RDL/ball region on a die is represented by region 118 of the die 100 in FIG. 1. The result of the CuSn intermetallic formation is an EM inducted void at the RDL/ball region 118 of the die 100. Specifically, the copper material of the metal distribution layer 110 may diffuse towards the solder ball 116, creating a void at the interface (e.g., region 118) of the metal distribution layer 110 and the solder ball 116. The void that is created between the metal distribution layer 110 and the solder ball 116 prevents a current from traversing to/from the solder ball 116 to the circuits (e.g., circuit elements in the substrate 101) of the die 101. In a die that operates at high current, the rate of diffusion is substantially greater, thus reducing the lifespan of the die and/or causing the die to be defective.

Therefore, there is a need for die that is more resistant to fast electromigration (EM) degradation.

SUMMARY

Various features, apparatus and methods described herein provide a stacked redistribution layers on a die A first example provides a semiconductor device that includes a substrate, several metal layers and dielectric layers coupled to the substrate, a pad coupled to one of the plurality of metal layers, a first metal redistribution layer coupled to the pad, and a second metal redistribution layer coupled to the first metal redistribution layer. The second metal redistribution layer includes a cobalt tungsten phosphorous material.

According to an aspect, the first metal redistribution layer is a copper layer.

According to one aspect, the semiconductor device further includes a first underbump metallization (UBM) layer and a second underbump metallization (UBM) layer.

According to an aspect, the semiconductor device further includes an adhesion layer between the first metal redistribution layer and the pad, the adhesion layer configured to couple the first metal redistribution layer to the pad.

According to one aspect, the semiconductor device is one of at least a die, a die package, an integrated circuit (IC), a wafer, and/or an interposer.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a semiconductor device that includes a substrate, several metal layers and dielectric layers coupled to the substrate, a pad coupled to one of the plurality of metal layers, a first metal redistribution layer coupled to the pad, a second metal redistribution layer coupled to the first metal redistribution layer; and a third metal redistribution layer coupled to the second metal redistribution layer.

According to one aspect, the first metal redistribution layer is a first copper layer, the second metal redistribution layer is a nickel layer, and the third metal redistribution layer is a second copper layer.

According to an aspect, the semiconductor device further includes a first underbump metallization (UBM) layer and a second underbump metallization (UBM) layer.

According to one aspect, the first UBM layer is a nickel layer, and the second UBM layer is a copper layer.

According to an aspect, the semiconductor device further includes an adhesion layer between the first metal redistribution layer and the pad. The adhesion layer is configured to couple the first metal redistribution layer to the pad.

According to one aspect, the semiconductor device is one of at least a die, a die package, an integrated circuit (IC), a wafer, and/or an interposer.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides an apparatus that includes a substrate, several metal layers and dielectric layers coupled to the substrate, a pad coupled to one of the several metal layers, a means for electrical redistribution, the means for electrical redistribution coupled to the pad, and a means for reducing degradation of the means for electrical redistribution, the means for reducing degradation coupled to the means for electrical redistribution.

According to an aspect, the means for electrical redistribution is a copper redistribution layer. The means for reducing degradation of the means for electrical redistribution includes a means for reducing copper degradation of the means for electrical redistribution.

According to one aspect, the apparatus further includes a first underbump metallization (UBM) layer and a second underbump metallization (UBM) layer.

According to an aspect, the apparatus further includes a means for adhesion between the means for electrical redistribution and the pad. The means for adhesion is configured to couple the means for electrical redistribution to the pad.

According to an aspect, the apparatus is one of at least a die, a die package, an integrated circuit (IC), a wafer, and/or an interposer.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides an apparatus that includes a substrate, several metal layers and dielectric layers coupled to the substrate, a pad coupled to one of the several metal layers, a first means for electrical redistribution, a means for reducing degradation of the first means for electrical redistribution, and a second means for electrical redistribution coupled to the means for reducing degradation of the first means for electrical redistribution. The first means for electrical redistribution is coupled to the pad. The means for reducing degradation is coupled to the first means for electrical redistribution.

According to an aspect, the means for reducing degradation of the first means for electrical redistribution further includes a means for reducing degradation of the second means for electrical redistribution.

According to an aspect, the first means for electrical redistribution is a first copper redistribution layer, the means for reducing degradation is a nickel redistribution layer, and the second means for electrical redistribution is a second redistribution copper layer.

According to an aspect, the apparatus further includes a first underbump metallization (UBM) layer and a second underbump metallization (UBM) layer.

According to an aspect, the first UBM layer is a nickel layer, and the second UBM layer is a copper layer.

According to an aspect, the apparatus further includes a means for adhesion between the first means for electrical redistribution and the pad. The means for adhesion is configured to couple the first means for electrical redistribution to the pad.

According to an aspect, the apparatus is one of at least a die, a die package, an integrated circuit (IC), a wafer, and/or an interposer.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fifth example provides a method for providing a semiconductor device. The method provides a substrate. The method also provides several metal layers and dielectric layers coupled to the substrate. The method further provides a pad coupled to one of the several metal layers. The method provides a first metal redistribution layer coupled to the pad. The method provides a second metal redistribution layer coupled to the first metal redistribution layer. The second metal redistribution layer includes a cobalt tungsten phosphorous material.

According to an aspect, the first metal redistribution layer is a copper layer.

According to an aspect, the method further provides a first underbump metallization (UBM) layer and a second underbump metallization (UBM) layer.

According to an aspect, the method further provides an adhesion layer between the first metal redistribution layer and the pad. The adhesion layer is configured to couple the first metal redistribution layer to the pad.

According to an aspect, the semiconductor device is one of at least a die, a die package, an integrated circuit (IC), a wafer, and/or an interposer.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A sixth example provides a method for providing a semiconductor device. The method provides a substrate. The method also provides several metal layers and dielectric layers coupled to the substrate. The method further provides a pad coupled to one of several metal layers. The method provides a first metal redistribution layer coupled to the pad. The method also provides a second metal redistribution layer coupled to the first metal redistribution layer. The method also provides a third metal redistribution layer coupled to the second metal redistribution layer.

According to an aspect, the first metal redistribution layer is a first copper layer, the second metal redistribution layer is a nickel layer, and the third metal redistribution layer is a second copper layer.

According to an aspect, the method further provides a first underbump metallization (UBM) layer and a second underbump metallization (UBM) layer.

According to one aspect, the first UBM layer is a nickel layer, and the second UBM layer is a copper layer.

According to an aspect, the method further provides an adhesion layer between the first metal redistribution layer and the pad. The adhesion layer is configured to couple the first metal redistribution layer to the pad.

According to one aspect, the semiconductor device is one of at least a die, a die package, an integrated circuit (IC), a wafer, and/or an interposer.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a semiconductor device (e.g., die) that includes a substrate, several metal layers and dielectric layers coupled to the substrate, a pad coupled to one of the plurality of metal layers, a first metal redistribution layer coupled to the pad, and a second metal redistribution layer coupled to the first metal redistribution layer. The second metal redistribution layer includes a cobalt tungsten phosphorous material. In some implementations, the first metal redistribution layer is a copper layer. In some implementations, the semiconductor device further includes a first underbump metallization (UBM) layer and a second underbump metallization (UBM) layer.

Some novel features also pertain to a semiconductor device (e.g. die) that includes a substrate, several metal layers and dielectric layers coupled to the substrate, a pad coupled to one of the plurality of metal layers, a first metal redistribution layer coupled to the pad, a second metal redistribution layer coupled to the first metal redistribution layer; and a third metal redistribution layer coupled to the second metal redistribution layer. In some implementations, the first metal redistribution layer is a first copper layer, the second metal redistribution layer is a nickel layer, and the third metal redistribution layer is a second copper layer. In some implementations, the semiconductor device further includes a first underbump metallization (UBM) layer and a second underbump metallization (UBM) layer.

Exemplary Dies That Include Stacked Redistribution Layers

Figure 1:
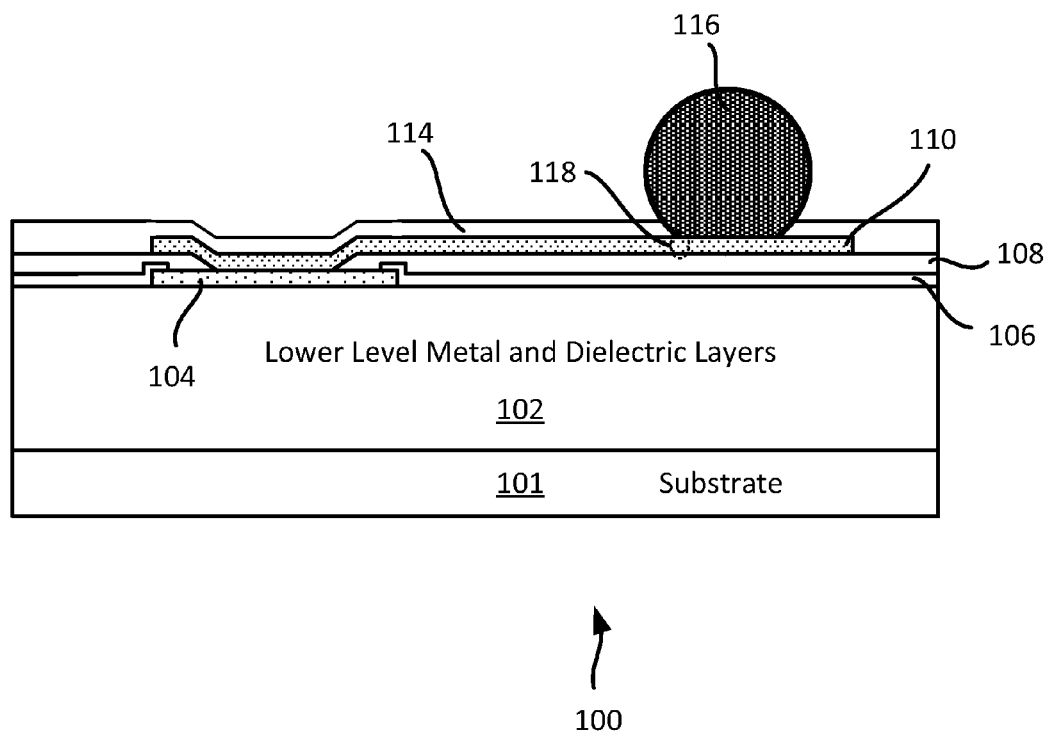
FIG. 1 illustrates a conventional die.
Figure 2:
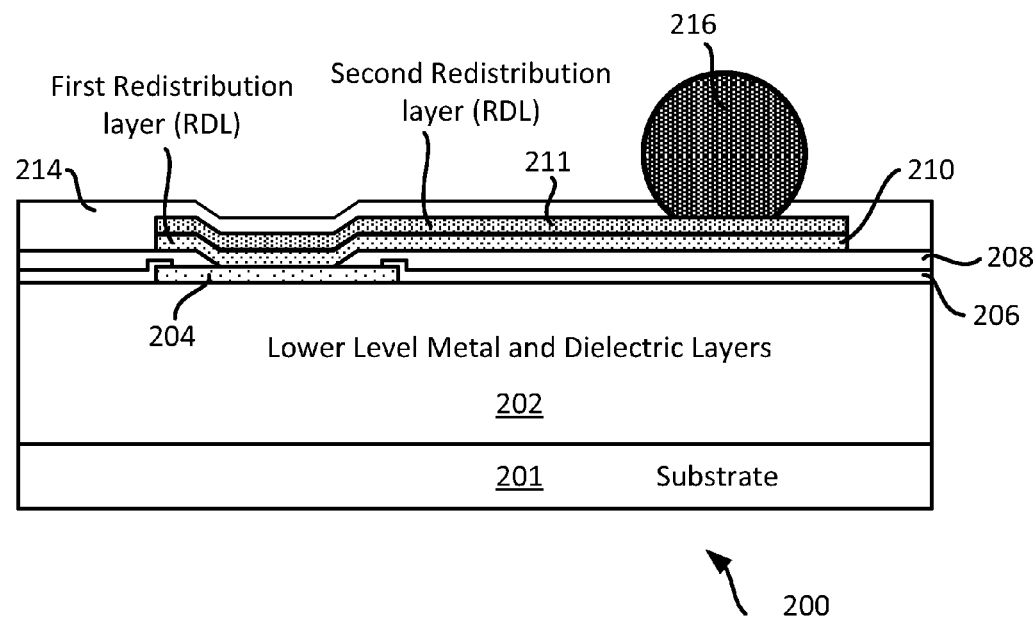
FIG. 2 illustrates an example of a die that includes several redistribution layers.

FIG. 2 illustrates an example of a side view of a die that is more resistant to fast electromigration (EM) degradation. Specifically, FIG. 2 illustrates a side view of a die 200 that includes a substrate 201, several metal and dielectric layers 202, a pad 204, a passivation layer 206, a first insulation layer 208, a first metal redistribution layer (RDL) 210, a second metal redistribution layer (RDL) 211, and a second insulation layer 214. FIG. 2 also illustrates a solder ball 216 on the die 200. Specifically, the solder ball 216 is coupled to the second metal redistribution layer 211. As shown in FIG. 2, the pad 104 is coupled to at least one of the lower level metal layers 202. The first metal redistribution layer 210 is coupled to the pad 204. The second metal redistribution layer 211 is coupled to the first metal redistribution layer 210. The pad 104, the first metal redistribution layer 210, and the second metal redistribution layer 211 are made of at least one conductive material. For example, the pad 204 may be an aluminum material.

In some implementations, the first metal redistribution layer 210 may be a copper layer and the second metal redistribution layer 211 may be a cobalt tungsten composite layer. For example, the second metal redistribution layer 211 may be a cobalt tungsten phosphorous (CoWP) layer. In the some implementations, the cobalt tungsten composite helps limits copper diffusion to the solder ball 216, thereby limiting/reducing the likelihood of voids at an interface (e.g., RDL/ball region) between the redistribution layers 210-211 and the solder ball 216. In some implementations, the second metal redistribution layer 211 is a means for reducing degradation of the first metal redistribution layer 210 (e.g., first means for electrical redistribution). Specifically, in some implementations, the second metal redistribution layer 211 is a means for reducing metal degradation (e.g., copper degradation) of the first metal redistribution layer 210. In some implementations, when the first metal redistribution layer 210 is copper, the diffusion of copper (Cu) ions during EM is fastest at the top surface of the first redistribution layer 210 (rather than through the bulk, grain boundary or sidewall of the metal). In some implementations, providing a metal cap (e.g., second redistribution layer 211) to the top surface of the first redistribution layer 210 significantly slows down the diffusion rate of the first redistribution layer 210, so that EM lifetimes drastically increase. In some implementations, when the second redistribution layer 211 includes CoWP, the cobalt portion of the second redistribution layer 211 may diffuse into the first redistribution layer 210, which increases the resistivity of the first redistribution layer 210. (This in turns, in some implementations, helps with the resistance to EM degradation.) As such, in some implementations, some portions (e.g. cobalt portion) of the second redistribution layer 211 may be configured to diffuse into the first redistribution layer 210.

In some implementations, the first metal redistribution layer 210 may be a nickel layer and the second metal redistribution layer 211 may be a copper layer. In the some implementations, the nickel layer helps limits copper diffusion to the solder ball 216, thereby limiting/reducing the likelihood of voids at an interface (e.g., RDL/ball region) between the redistribution layers 210-211 and the solder ball 216.

Figure 3:
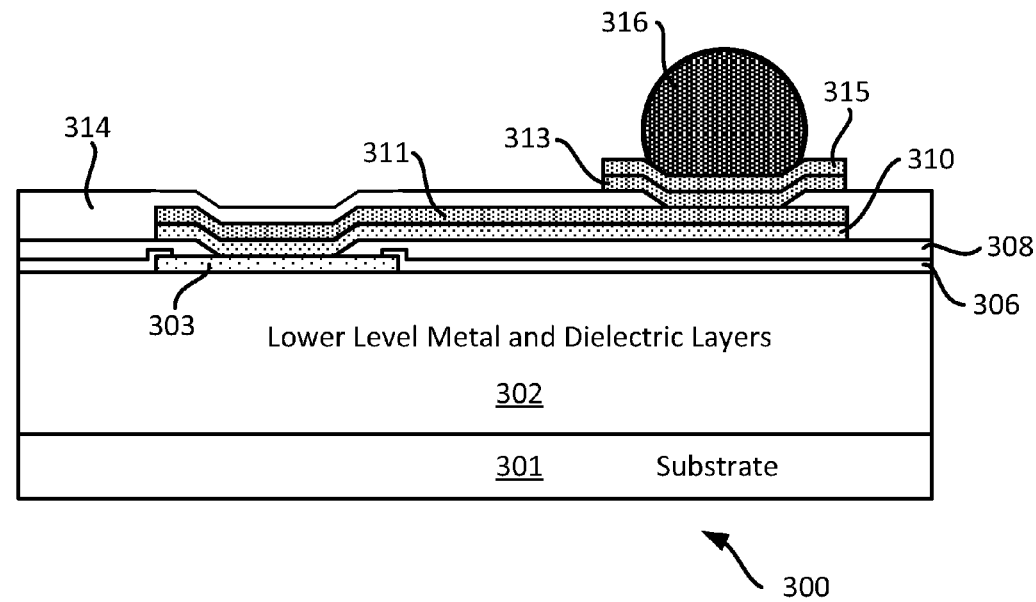
FIG. 3 illustrates an example of a die that includes several redistribution layers and several underbump metallization layers.

In some implementations, a die may be made more resistant to copper diffusion by providing several stacked underbump metallization (UBM) layers. FIG. 3 illustrates an example of a side view of a die that is more resistant to fast electromigration (EM) degradation through the use of stacked UBM layers. Specifically, FIG. 3 illustrates a side view of a die 300 that includes a substrate 301, several metal and dielectric layers 302, a pad 304, a passivation layer 306, a first insulation layer 308, a first metal redistribution layer (RDL) 310, a second metal redistribution layer (RDL) 311, a second insulation layer 314, a first underbump metallization (UBM) layer 313, and a second underbump metallization (UBM) layer 315.

FIG. 3 also illustrates a solder ball 316 on the die 300. Specifically, the solder ball 316 is coupled to the second UBM layer 315. As shown in FIG. 3, the pad 304 is coupled to at least one of the lower level metal layers 302. The first metal redistribution layer 310 is coupled to the pad 304. The second metal redistribution layer 311 is coupled to the first metal redistribution layer 310. The first UBM layer 313 is coupled to the second metal redistribution layer 311. The second UBM layer 315 is coupled to the first UBM layer 313. The pad 304, the first metal redistribution layer 310, the second metal redistribution layer 311, the first UBM layer 313, and the second UBM layer 315 are made of at least one conductive material. For example, the pad 304 may be an aluminum material.

In some implementations, the first metal redistribution layer 310 may be a nickel layer and the second metal redistribution layer 311 may be a copper layer. In some implementations, the first UBM layer 313 may be a nickel layer and the second UBM layer 315 may be a copper layer.

In some implementations, the second metal redistribution layer 311 is a means for reducing degradation of the first metal redistribution layer 310 (e.g., first means for electrical redistribution). Specifically, in some implementations, the second metal redistribution layer 311 is a means for reducing copper degradation of the first metal redistribution layer 310.

Figure 4:
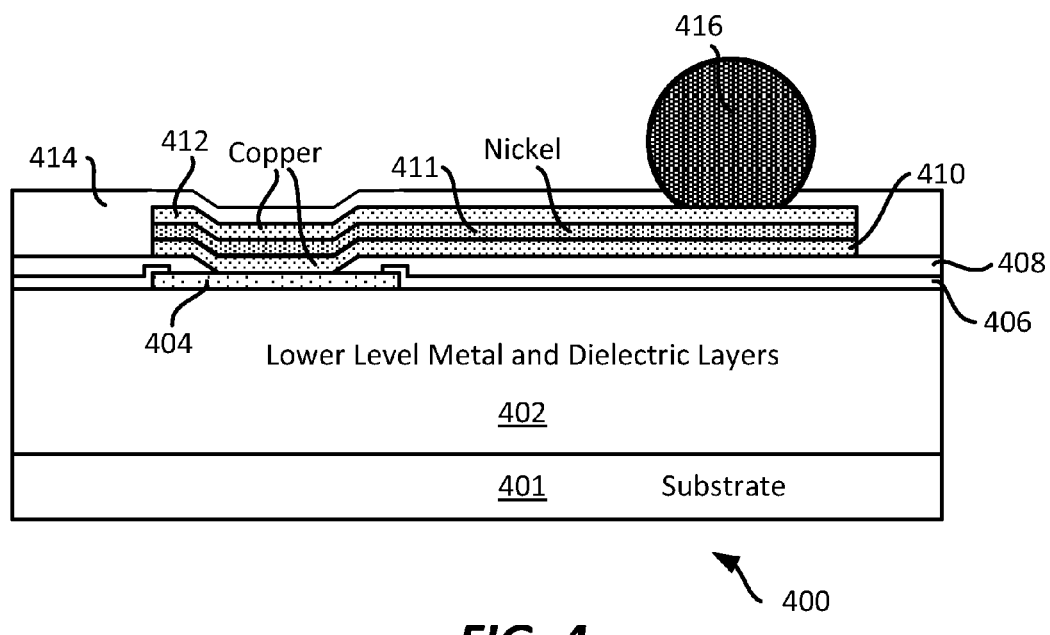
FIG. 4 illustrates another example of a die that includes several redistribution layers.

In some implementations, a die may have more than two redistribution layers. FIG. 4 illustrates another example of a side view of a die that is more resistant to fast electromigration (EM) degradation. Specifically, FIG. 4 illustrates a side view of a die 400 that includes a substrate 401, several metal and dielectric layers 402, a pad 404, a passivation layer 406, a first insulation layer 408, a first metal redistribution layer (RDL) 410, a second metal redistribution layer (RDL) 411, a third metal redistribution layer (RDL) 412, and a second insulation layer 414.

FIG. 4 also illustrates a solder ball 416 on the die 400. Specifically, the solder ball 416 is coupled to the third metal redistribution layer 412. As shown in FIG. 4, the pad 404 is coupled to at least one of the lower level metal layers 402. The first metal redistribution layer 410 is coupled to the pad 404. The second metal redistribution layer 411 is coupled to the first metal redistribution layer 410. The third metal redistribution layer 412 is coupled to the second metal redistribution layer 411. The pad 404, the first metal redistribution layer 410, the second metal redistribution layer 411, and the third metal redistribution layer 412 are made of at least one conductive material.

In some implementations, the first metal redistribution layer 410 may be a first copper layer, the second metal redistribution layer 411 may be a nickel layer, and the third metal redistribution layer 412 may be a second copper layer.

In some implementations, the second metal redistribution layer 411 is a means for reducing degradation of the first metal redistribution layer 410 (e.g., first means for electrical redistribution) and/or third metal redistribution layer 412 (e.g., second means for electrical redistribution). Specifically, in some implementations, the second metal redistribution layer 411 is a means for reducing copper degradation of the first metal redistribution layer 410 and/or third metal redistribution layer 412.

In some implementations, a die may includes more than two redistribution layers and several stacked underbump metallization (UBM) layers. The combination of several redistribution layers and several UBM layers may make a die more resistant to copper diffusion.

Figure 5:
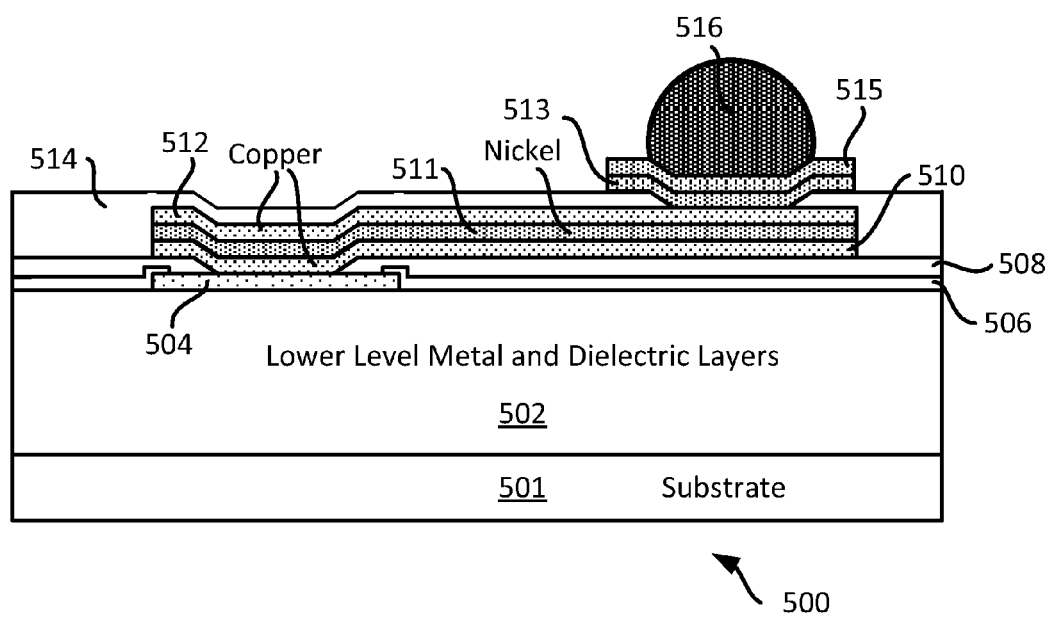
FIG. 5 illustrates another example of a die that includes several redistribution layers and several underbump metallization layers.

FIG. 5 illustrates another example of a side view of a die that is more resistant to fast electromigration (EM) degradation. FIG. 5 is similar to FIG. 4, except that the die includes several UBM layers. Specifically, FIG. 5 illustrates a side view of a die 500 that includes a substrate 501, several metal and dielectric layers 502, a pad 504, a passivation layer 506, a first insulation layer 508, a first metal redistribution layer (RDL) 510, a second metal redistribution layer (RDL) 511, a third metal redistribution layer (RDL) 512, a second insulation layer 514, a first underbump metallization (UBM) layer 513 and a second underbump metallization (UBM) layer 515.

As shown in FIG. 5, the pad 504 is coupled to at least one of the lower level metal layers 502. The first metal redistribution layer 510 is coupled to the pad 504. The second metal redistribution layer 511 is coupled to the first metal redistribution layer 510. The third metal redistribution layer 512 is coupled to the second metal redistribution layer 511.

The first UBM layer 513 is coupled to the second metal redistribution layer 511. The second UBM layer 515 is coupled to the first UBM layer 513. The pad 504, the first metal redistribution layer 510, the second metal redistribution layer 511, the third metal redistribution layer 512, the first UBM layer 513 and the second UBM layer 515 are made of at least one conductive material. In some implementations, the first metal redistribution layer 510 may be a first copper layer, the second metal redistribution layer 511 may be a nickel layer, and the third metal redistribution layer 512 may be a second copper layer.

In some implementations, the second metal redistribution layer 511 is a means for reducing degradation of the first metal redistribution layer 510 (e.g., first means for electrical redistribution) and/or third metal redistribution layer 512 (e.g., second means for electrical redistribution). Specifically, in some implementations, the second metal redistribution layer 511 is a means for reducing metal degradation (e.g., copper degradation) of the first metal redistribution layer 510 and/or third metal redistribution layer 512.

FIG. 5 also illustrates a solder ball 516 on the die 500. Specifically, the solder ball 516 is coupled to the second UBM layer 515.

Exemplary Dies That Includes Several Redistribution Layers and/or Several Underbump Metallization Layers With Adhesion Layer FIGS. 2-5 illustrate conceptual examples of dies configured to be more resistant to copper diffusion. FIGS. 6-9 illustrate more detailed examples of dies configured to be more resistant to copper diffusion. Specifically, FIGS. 6-9 illustrate dies that includes several redistribution layers and/or several UBM layers, with the adhesion layer (e.g., means for adhesion) illustrated in the figures.

In some implementations, an adhesion layer (e.g., means for adhesion) may be provided between an insulation layer and a metal redistribution layer. The adhesion layer may be a glue layer that is configured to couple a metal redistribution layer (e.g. first metal redistribution layer) to a first insulation layer.

Figure 6:
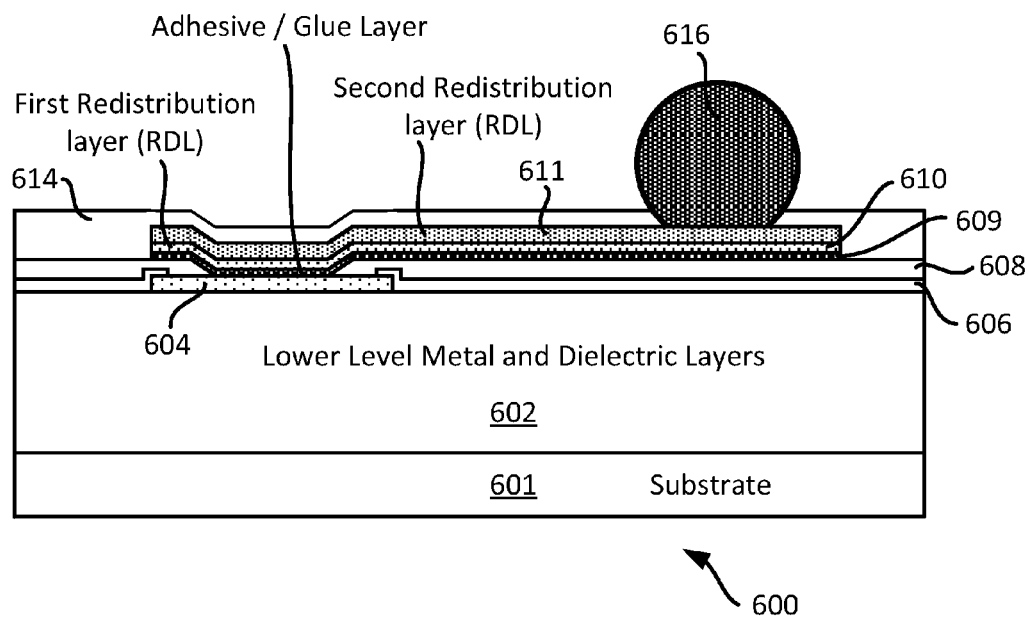
FIG. 6 illustrates an example of a die that includes several redistribution layers and an adhesion layer.

FIG. 6 illustrates an example of a side view of a die that is more resistant to fast electromigration (EM) degradation. Specifically, FIG. 6 illustrates a side view of a die 600 that includes a substrate 601, several metal and dielectric layers 602, a pad 604, a passivation layer 606, a first insulation layer 608, an adhesion layer 609, a first metal redistribution layer (RDL) 610, a second metal redistribution layer (RDL) 611, and a second insulation layer 614. FIG. 6 also illustrates a solder ball 616 on the die 600. Specifically, the solder ball 616 is coupled to the second metal redistribution layer 611. As shown in FIG. 6, the pad 104 is coupled to at least one of the lower level metal layers 602. The first metal redistribution layer 610 is coupled to the pad 604. The adhesion layer 609 (e.g., glue layer) is between the first metal redistribution layer 610 and the pad 604 and the first insulation layer 608. In some implementations, the adhesion layer 609 is configured to couple the first metal redistribution layer 610 to the pad 604 and/or the first insulation layer 608. The second metal redistribution layer 611 is coupled to the first metal redistribution layer 610. The pad 104, the first metal redistribution layer 610, and the second metal redistribution layer 611 are made of at least one conductive material. For example, the pad 604 may be an aluminum material.

In some implementations, the first metal redistribution layer 610 may be a copper layer and the second metal redistribution layer 611 may be a cobalt tungsten composite layer. For example, the second metal redistribution layer 611 may be a cobalt tungsten phosphorous (CoWP) layer. In the some implementations, the cobalt tungsten composite helps limits copper diffusion to the solder ball 616, thereby limiting/reducing the likelihood of voids at an interface (e.g., RDL/ball region) between the redistribution layers 610-611 and the solder ball 616.

In some implementations, the first metal redistribution layer 610 may be a nickel layer and the second metal redistribution layer 611 may be a copper layer. In the some implementations, the nickel layer helps limits copper diffusion to the solder ball 616, thereby limiting/reducing the likelihood of voids at an interface (e.g., RDL/ball region) between the redistribution layers 610-611 and the solder ball 616.

Figure 7:
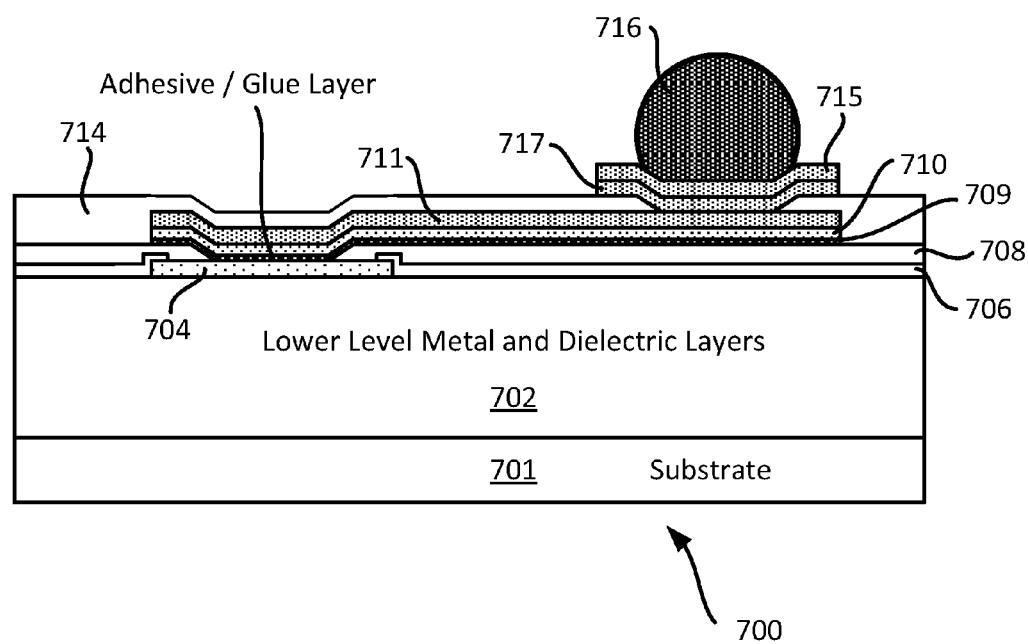
FIG. 7 illustrates an example of a die that includes several redistribution layers, several underbump metallization layers and an adhesion layer.

In some implementations, a die may be made more resistant to copper diffusion by providing several stacked underbump metallization (UBM) layers. FIG. 7 illustrates an example of a side view of a die that is more resistant to fast electromigration (EM) degradation through the use of stacked UBM layers. Specifically, FIG. 7 illustrates a side view of a die 700 that includes a substrate 701, several metal and dielectric layers 702, a pad 704, a passivation layer 706, a first insulation layer 708, an adhesion layer 709, a first metal redistribution layer (RDL) 710, a second metal redistribution layer (RDL) 711, a second insulation layer 714, a first underbump metallization (UBM) layer 713, and a second underbump metallization (UBM) layer 715.

FIG. 7 also illustrates a solder ball 716 on the die 700. Specifically, the solder ball 716 is coupled to the second UBM layer 715. As shown in FIG. 7, the pad 704 is coupled to at least one of the lower level metal layers 702. The first metal redistribution layer 710 is coupled to the pad 704. The adhesion layer 709 (e.g., glue layer) is between the first metal redistribution layer 710 and the pad 704 and the first insulation layer 708. In some implementations, the adhesion layer 709 is configured to couple the first metal redistribution layer 710 to the pad 704 and/or the first insulation layer 708. The second metal redistribution layer 711 is coupled to the first metal redistribution layer 710. The first UBM layer 713 is coupled to the second metal redistribution layer 711. The second UBM layer 715 is coupled to the first UBM layer 713. The pad 704, the first metal redistribution layer 710, the second metal redistribution layer 711, the first UBM layer 713, and the second UBM layer 715 are made of at least one conductive material. For example, the pad 704 may be an aluminum material.

In some implementations, the first metal redistribution layer 710 may be a nickel layer and the second metal redistribution layer 711 may be a copper layer. In some implementations, the first UBM layer 713 may be a nickel layer and the second UBM layer 715 may be a copper layer.

Figure 8:
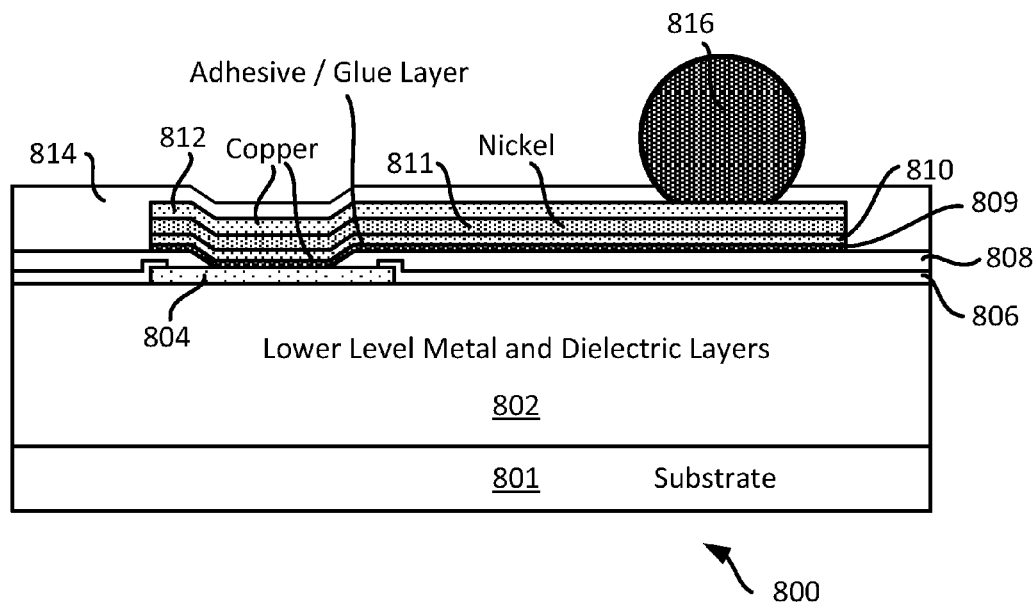
FIG. 8 illustrates another example of a die that includes several redistribution layers and an adhesion layer.

In some implementations, a die may have more than two redistribution layers. FIG. 8 illustrates another example of a side view of a die that is more resistant to fast electromigration (EM) degradation. FIG. 8 is similar to FIG. 6, except that the die includes three stacked redistribution layers. Specifically, FIG. 8 illustrates a side view of a die 800 that includes a substrate 801, several metal and dielectric layers 802, a pad 804, a passivation layer 806, a first insulation layer 808, an adhesive layer 809, a first metal redistribution layer (RDL) 810, a second metal redistribution layer (RDL) 811, a third metal redistribution layer (RDL) 812, and a second insulation layer 814.

FIG. 8 also illustrates a solder ball 816 on the die 800. Specifically, the solder ball 816 is coupled to the third metal redistribution layer 812. As shown in FIG. 8, the pad 804 is coupled to at least one of the lower level metal layers 802. The first metal redistribution layer 810 is coupled to the pad 804. The adhesion layer 809 (e.g., glue layer) is between the first metal redistribution layer 810 and the pad 804 and the first insulation layer 808. In some implementations, the adhesion layer 809 is configured to couple the first metal redistribution layer 810 to the pad 804 and/or the first insulation layer 808. The second metal redistribution layer 811 is coupled to the first metal redistribution layer 810. The third metal redistribution layer 812 is coupled to the second metal redistribution layer 811. The pad 804, the first metal redistribution layer 810, the second metal redistribution layer 811, and the third metal redistribution layer 812 are made of at least one conductive material.

In some implementations, the first metal redistribution layer 810 may be a first copper layer, the second metal redistribution layer 811 may be a nickel layer, and the third metal redistribution layer 812 may be a second copper layer.

In some implementations, a die may includes more than two redistribution layers and several stacked underbump metallization (UBM) layers. The combination of several redistribution layers and several UBM layers may make a die more resistant to copper diffusion.

Figure 9:
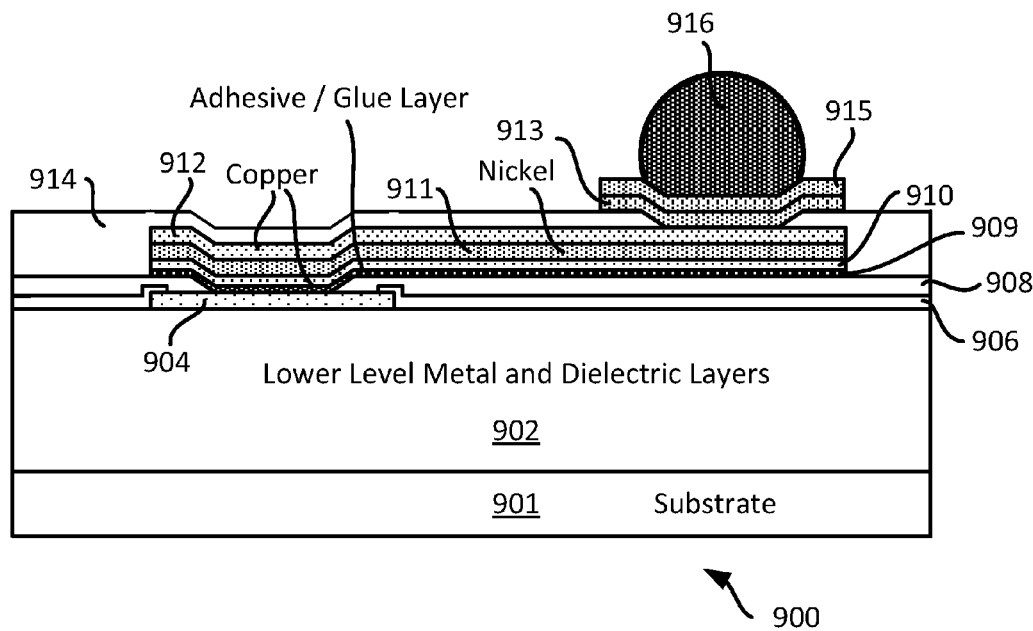
FIG. 9 illustrates another example of a die that includes several redistribution layers, several underbump metallization layers and an adhesion layer.

FIG. 9 illustrates another example of a side view of a die that is more resistant to fast electromigration (EM) degradation. FIG. 9 is similar to FIG. 7, except that the die includes several UBM layers. Specifically, FIG. 9 illustrates a side view of a die 900 that includes a substrate 901, several metal and dielectric layers 902, a pad 904, a passivation layer 906, a first insulation layer 908, an adhesion layer 909, a first metal redistribution layer (RDL) 910, a second metal redistribution layer (RDL) 911, a third metal redistribution layer (RDL) 912, a second insulation layer 914, a first underbump metallization (UBM) layer 913 and a second underbump metallization (UBM) layer 915.

As shown in FIG. 9, the pad 904 is coupled to at least one of the lower level metal layers 902. The first metal redistribution layer 910 is coupled to the pad 904. The adhesion layer 909 (e.g., glue layer) is between the first metal redistribution layer 910 and the pad 904 and the first insulation layer 908. In some implementations, the adhesion layer 909 is configured to couple the first metal redistribution 910 to the pad 904 and/or the first insulation layer 908.

The second metal redistribution layer 911 is coupled to the first metal redistribution layer 910. The third metal redistribution layer 912 is coupled to the second metal redistribution layer 911. The first UBM layer 913 is coupled to the second metal redistribution layer 911. The second UBM layer 915 is coupled to the first UBM layer 913. The pad 904, the first metal redistribution layer 910, the second metal redistribution layer 911, the third metal redistribution layer 912, the first UBM layer 913 and the second UBM layer 915 are made of at least one conductive material. In some implementations, the first metal redistribution layer 910 may be a first copper layer, the second metal redistribution layer 911 may be a nickel layer, and the third metal redistribution layer 912 may be a second copper layer.

Having described various implementations and/or embodiments of a die that is more resistant to copper diffusion, a sequence for providing/manufacturing one or more die that includes stacked redistribution layers and/or stacked UBM layers.

Exemplary Sequence for Providing/Manufacturing a Die That Includes Stacked Redistribution Layers and/or stacked UBM layers.

FIGS. 10A-10E illustrate an exemplary sequence for providing a die that includes several redistribution layers and/or several underbump metallization (UBM) layers. In some implementations, the sequence of FIGS. 10A-10E may be used to provide/manufacture the die of FIGS. 2-9 or other dies described in the present disclose.

Figure 10A:
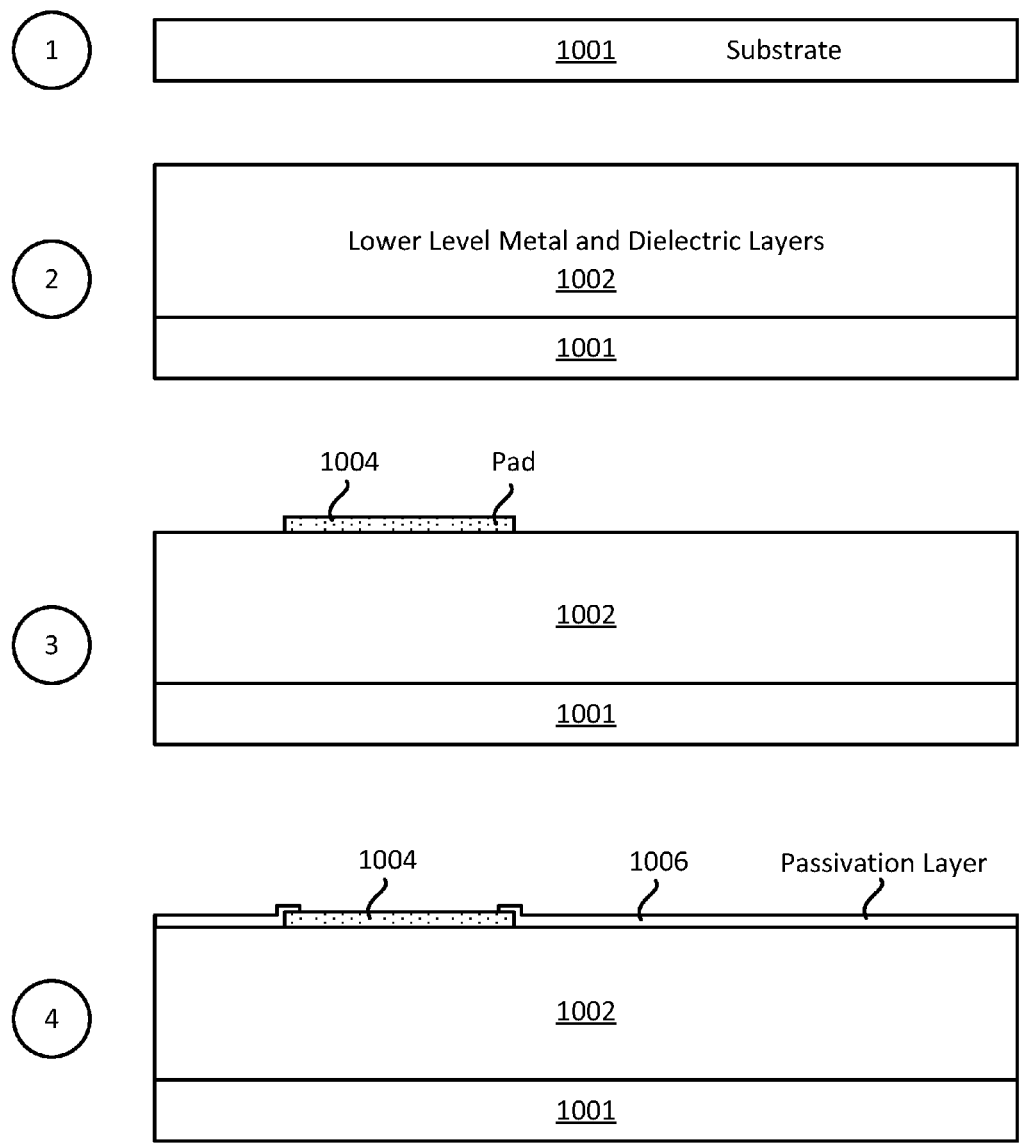
FIG. 10A illustrates part of an exemplary sequence for providing/manufacturing a die that includes several redistribution layers and/or underbump metallization layers.

As shown in stage 1 of FIG. 10A, a substrate (e.g., substrate 1001) is provided. In some implementations, the substrate is a wafer. Different implementations may use different materials for the substrate (e.g., silicon substrate, glass substrate).

At stage 2, several lower level metal and dielectric layers (e.g., lower level metal and dielectric layers 1002) are provided on the substrate. Different implementations may provide different number of lower level metal and dielectric layers (e.g., M1 metal layer, M2 metal layer, M3 metal layer, M4 metal layer, M5 metal layer, M6 metal layer, M7 metal layer).

At stage 3, at least one pad (e.g., pad 1004) is provided on the lower level metal and dielectric layers 1002. In some implementations, the pad is coupled to one of the lower level metal layer (e.g., the top lower level metal layer, M7 metal layer). In some implementations, the pad 1004 is an aluminum pad. However, different implementations may use different materials for the pad 1004. Different implementations may use different processes for providing the pad on the lower level metal and dielectric layers 1002. For example, in some implementations, a lithography and/or etching process may be use to provide the pad 1004 on the lower level metal and dielectric layers 1002.

At stage 4, a passivation layer (e.g., passivation layer 1006) is provided on the lower level metal and dielectric layers 1002. Different implementations may use different materials for the passivation layer. As shown in stage 4, the passivation layer 406 is provided on the lower level metal and dielectric layers 1002 such that at least a portion of the pad 1004 is exposed.

Figure 10B:
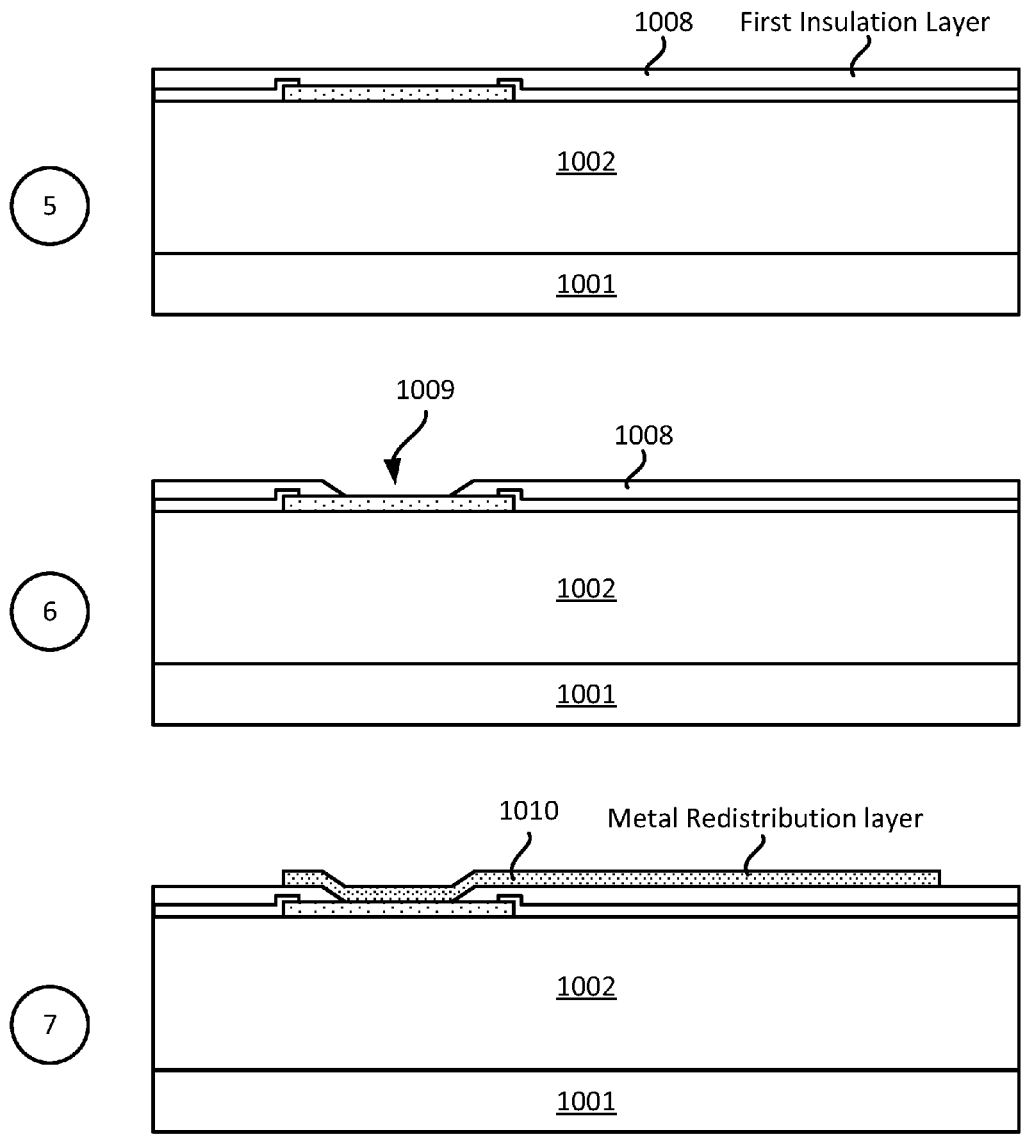
FIG. 10B illustrates part of an exemplary sequence for providing/manufacturing a die that includes several redistribution layers and/or underbump metallization layers.

At stage 5 of FIG. 10B, a first insulation layer (e.g., first insulation layer 1008) is provided on the passivation layer 1006 and the pad 1004. Different implementations may use different materials for the first insulation layer 1008. For example, the first insulation layer 1008 may be a Polybenzoxazole (PbO) layer or a polymer layer.

At stage 6, a cavity (e.g., cavity 1009) is provided/created in the first insulation layer 1008. As further shown in stage 6, the cavity 1009 is created over the pad 1004. Different implementations may create the cavity 1009 differently. For example, the cavity 1009 may be provided/created by etching the first insulation layer 1008.

At stage 7, a first metal redistribution layer is provided. Specifically, a first metal redistribution layer 1010 is provided over the pad 1004 and the first insulation layer 1008. As shown in stage 7, the first metal redistribution layer 1010 is coupled to the pad 1004. In some implementations, the first metal redistribution layer 1010 is a copper layer. However, different implementations may use different materials for the first metal redistribution layer. For example, the first metal redistribution layer may be nickel and/or cobalt tungsten composite (e.g., cobalt tungsten phosphorous (CoWP)).

In some implementations, an adhesive layer (not shown) is provided between the first metal redistribution layer 1010 and the pad 1004 and the first insulation layer 1008. For example, the adhesive layer may be adhesive layers, 609, 709, 809, and/or 909. In some implementations, the adhesive layer is configured to couple the first metal redistribution 1010 to the pad 1004 and/or the first insulation layer 1008. In some implementations, the adhesive layer is provided before the first metal redistribution layer.

Different implementations may use different processes for providing the first metal redistribution layer. In some implementations, the first metal redistribution layer may be deposited/plated on the pad and/or the insulation layer. In some implementations, some of the metal redistribution layer may be selectively etched to define/form one or more of the first metal redistribution layer.

At stage 8, a second metal redistribution layer is provided. Specifically, a second metal redistribution layer 1011 is provided over the first metal redistribution layer 1010. In some implementations, the first metal redistribution layer 1010 is a copper layer. However, different implementations may use different materials for the second metal redistribution layer. For example, the second metal redistribution layer may be nickel and/or cobalt tungsten composite (e.g., cobalt tungsten phosphorous (CoWP)). In some implementations, an adhesive layer is not necessary to couple the second metal redistribution layer to the first metal redistribution layer.

Different implementations may use different processes for providing the second metal redistribution layer. In some implementations, the second metal redistribution layer may be deposited/plated on the first redistribution layer. In some implementations, some of the second metal redistribution layer may be selectively etched to define/form one or more of the second metal redistribution layer.

Figure 10C:
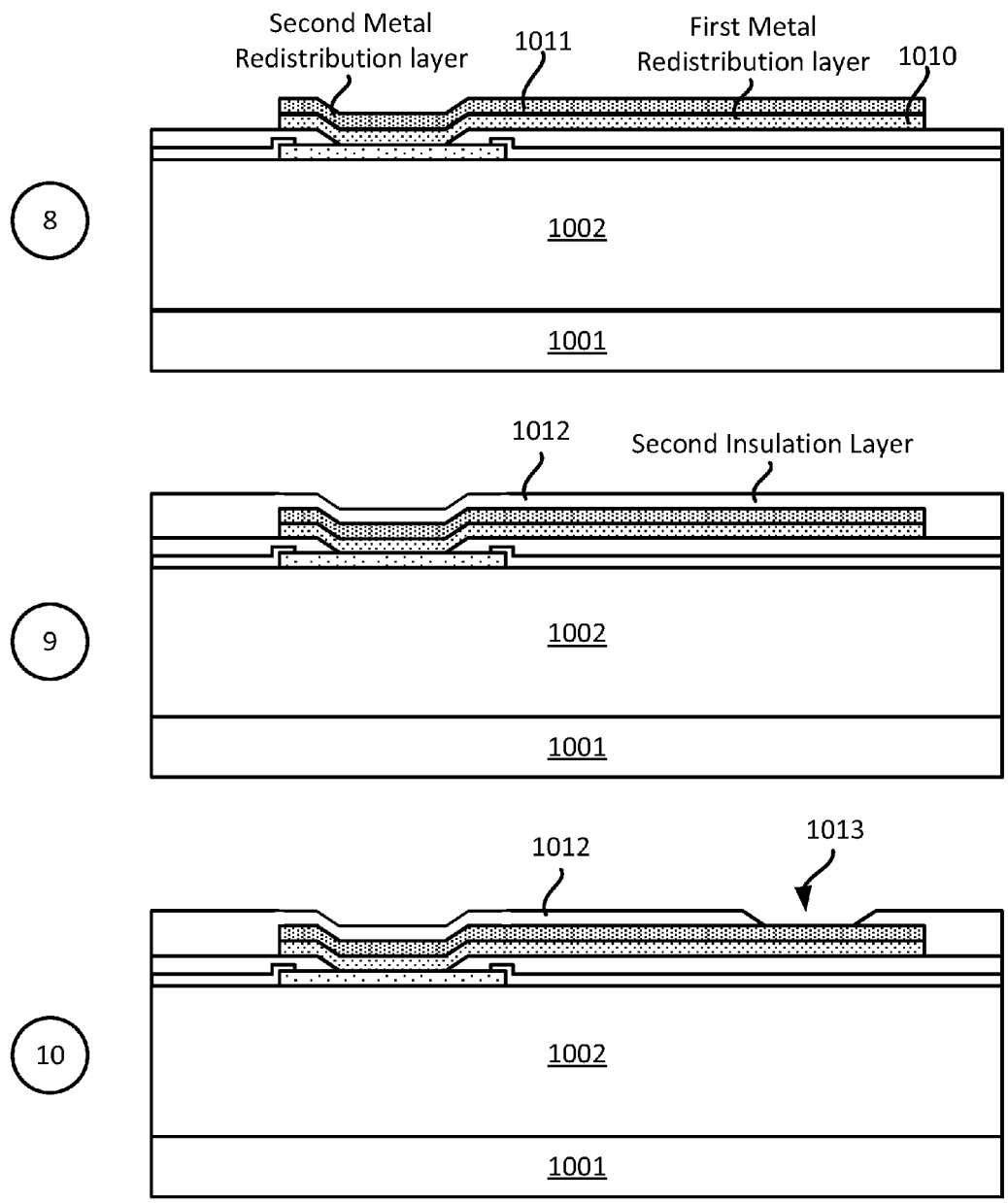
FIG. 10C illustrates part of an exemplary sequence for providing/manufacturing a die that includes several redistribution layers and/or underbump metallization layers.

At stage 9 of FIG. 10C, a second insulation layer (e.g., second insulation layer 1012) is provided on the first insulation layer 1008 and the second metal redistribution layer 1011. Different implementations may use different materials for the second insulation layer 1012. For example, the second insulation layer 1012 may be a Polybenzoxazole (PbO) layer or a polymer layer.

At stage 10, a cavity (e.g., cavity 1013) is provided/created in the second insulation layer 1012. Different implementations may create the cavity 1013 differently. For example, the cavity 1013 may be provided/created by etching the second insulation layer 1012.

Figure 10D:
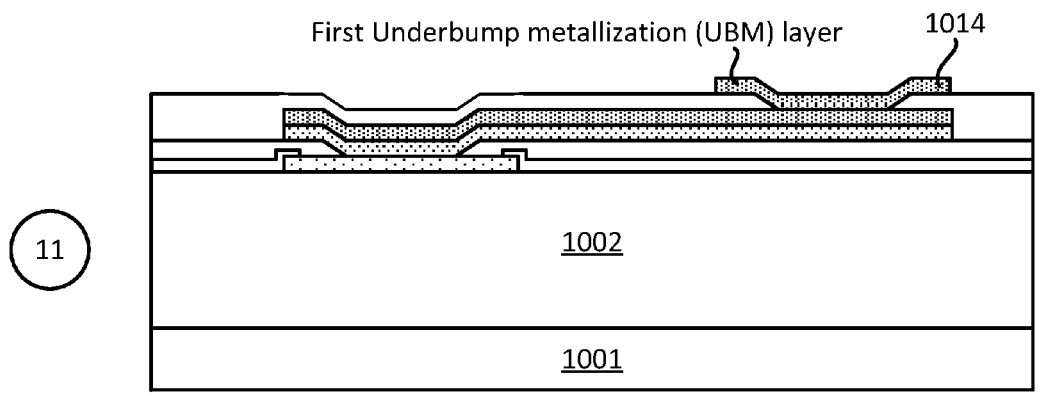
FIG. 10D illustrates part of an exemplary sequence for providing/manufacturing a die that includes several redistribution layers and/or underbump metallization layers.
Figure 10D:
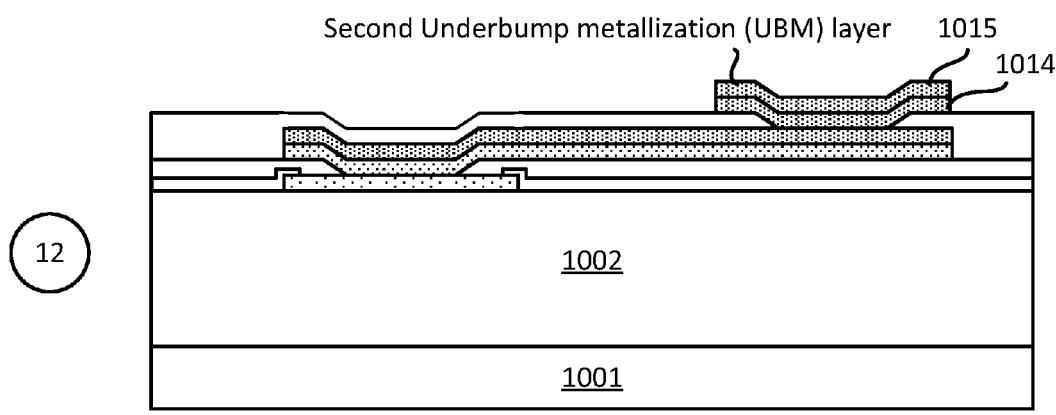

At stage 11 of FIG. 10D, a first under bump metallization (UBM) layer is provided. Specifically, a first under bump metallization (UBM) layer 1014 is provided in the cavity 1013 of the second insulation layer 1012. As shown at stage 11, the first UBM layer 1014 is coupled to the first metal redistribution layer 1010. In some implementations, the first UBM layer 1014 is a copper layer. However, different implementations may use different materials for the first UBM layer. For example, the first UBM layer may be nickel and/or cobalt tungsten composite (e.g., cobalt tungsten phosphorous (CoWP)).

At stage 12, a second under bump metallization (UBM) layer is provided. Specifically, a second under bump metallization (UBM) layer 1015 is provided on the first UBM layer 1014. As shown at stage 12, the second UBM layer 1015 is coupled to the first UBM layer 1014. In some implementations, the second UBM layer 1015 is a copper layer. However, different implementations may use different materials for the second UBM layer. For example, the second UBM layer may be nickel and/or cobalt tungsten composite (e.g., cobalt tungsten phosphorous (CoWP)).

Figure 10E:
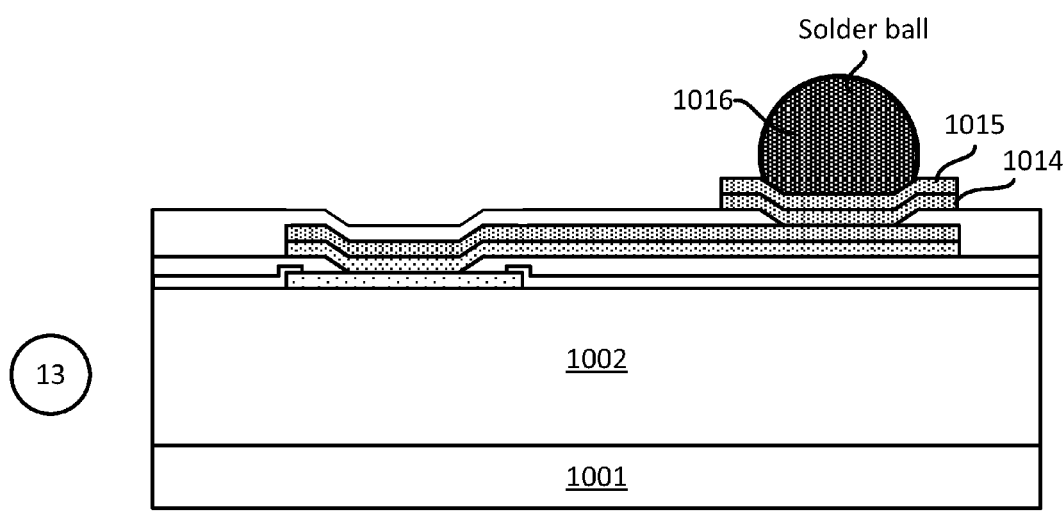
FIG. 10E illustrates part of an exemplary sequence for providing/manufacturing a die that includes several redistribution layers and/or underbump metallization layers.

At stage 13 of FIG. 10E, a solder ball is provided on the UBM layer. Specifically, a solder ball 1016 is coupled to the second UBM layer 1015.

It should be noted that some of the stages may be optional and thus may be skipped, bypassed in some implementations. In some instances, additional stages may be performed. For example, in some implementations more than two redistribution layers may be provided (e.g., first, second, and third redistribution layers). Also, in some implementations, providing the UBM layer (at stages 11 and/or 12) may be skipped. That is, in some implementations, no UBM layer is provided or a single UBM layer (e.g., first UBM layer) is provided.

Having described an example of a sequence for providing/manufacturing a die that is more resistant to copper diffusion, an example of a method for providing/manufacturing one or more die that includes stacked redistribution layers and/or stacked UBM layers.

Figure 11:
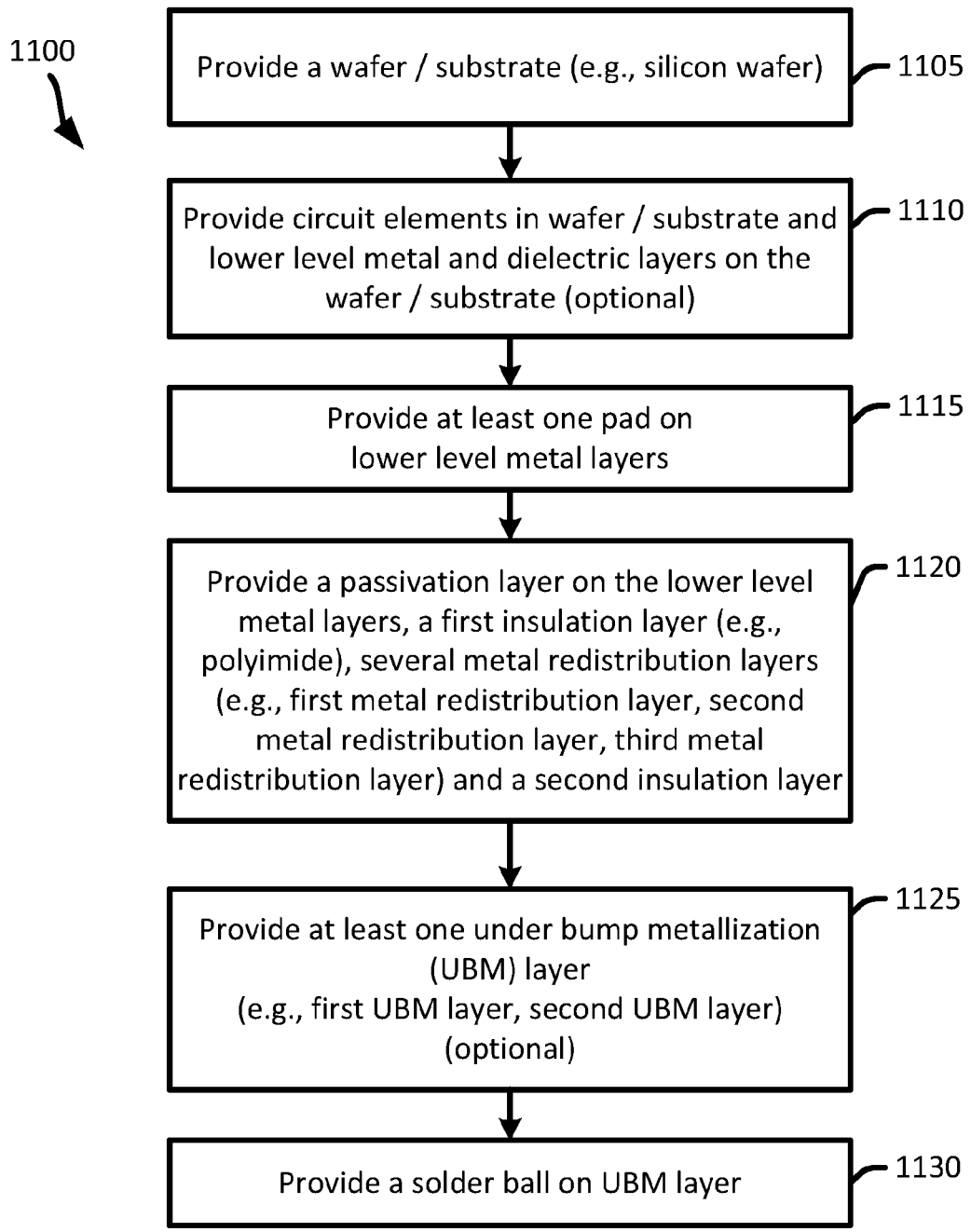
FIG. 11 illustrates an exemplary method for providing/manufacturing a die that includes several redistribution layers and/or underbump metallization layers.

Exemplary Method for Providing/Manufacturing a Die That Includes Several Redistribution Layer and/or Several Under-bump Metallization Layer FIG. 11 illustrates an exemplary method for providing/manufacturing one or more die that includes stacked redistribution layers and/or stacked UBM layers. In some implementations, the method of FIG. 11 may be used to provide/manufacture the die of FIGS. 2-9 or other dies described in the present disclose.

The method provides (at 1105) a substrate (e.g., substrate 1001). In some implementations, providing (at 1105) the substrate includes providing a wafer (e.g., silicon wafer). However, different implementations may use different materials for the substrate (e.g., glass substrate). The method then optionally provides (at 1110) circuit elements in the substrate and several lower level metal and dielectric layers on the substrate. Different implementations may provide different number of lower level metal and dielectric layers (e.g., M1-M7 metal layers). In some implementations, providing (at 1110) the circuit elements may be bypassed. For example, when an interposer is manufactured from a substrate/wafer, some implementations may skip providing circuit elements (e.g., skip manufacturing active circuit elements). As such, some implementations may provide the lower level and dielectric layer but not the circuit elements. However, it should be noted that in some implementations, an interposer may include active circuit elements.

The method further provides (at 1115) at least one pad (e.g., pad 1004) on one of the lower level metal and dielectric layers (e.g., M7 metal layer). In some implementations, providing (at 1115) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal and dielectric layers. For example, in some implementations, a lithography and/or etching process may be use to provide (at 1115) the pad on the lower level metal and dielectric layers.

The method provides (at 1120) a passivation layer (e.g., passivation layer 1006), a first insulation layer (e.g., first insulation layer 1008), several redistribution layers (e.g., first metal redistribution layer 1010, second metal redistribution layer 1011), and a second insulation layer (e.g., second insulation layer 1012). Different implementations may use different materials for the passivation layer. In some implementations, the passivation layer is provided on the lower level metal and dielectric layers such that at least a portion of the pad is exposed.

In some implementations, the several metal redistribution layers are provided. For example, first, second and/or third metal redistribution layers may be provided in some implementations. The first, second and/or third metal redistribution layers may use different materials including copper, nickel and/or cobalt tungsten composite (e.g., cobalt tungsten phosphorous (CoWP)). In some implementations, an adhesive layer is provided between a first metal redistribution layer and the pad and the first insulation layer. In some implementations, the adhesive layer is configured to couple the first metal redistribution to the pad and/or the first insulation layer. In some implementations, the adhesive layer is provided before the first metal redistribution layer.

Different implementations may use different processes for providing the metal redistribution layers. In some implementations, the metal redistribution layers may be deposited/plated. In some implementations, some of the metal redistribution layers may be selectively etched to define/form one or more of the metal redistribution layers.

Different implementations may use different materials for the first and second insulation layers. For example, the first and second insulation layers may be a Polybenzoxazole (PbO) layer and/or a polymer layer.

The method then optionally provides (at 1125) at least one under bump metallization (UBM) layer (e.g., first UBM layer, second UBM layer). In some implementations, providing (at 1125) the UBM layer includes coupling a first UBM layer to a metal redistribution layer (e.g., second metal redistribution layer, third metal redistribution layer). In some implementations, the one or more of the UBM layer is a copper layer. However, different implementations may use different materials for the UBM layers.

The method further provides (at 1130) a solder ball on the UBM layer (e.g., second UBM layer). In the case that no UBM layer is provided (at 1125), the solder ball may be provided (at 1130) on a metal redistribution layer (e.g., second metal redistribution layer, third metal redistribution layer) in some implementations.

Exemplary Electronic Devices

Figure 12:
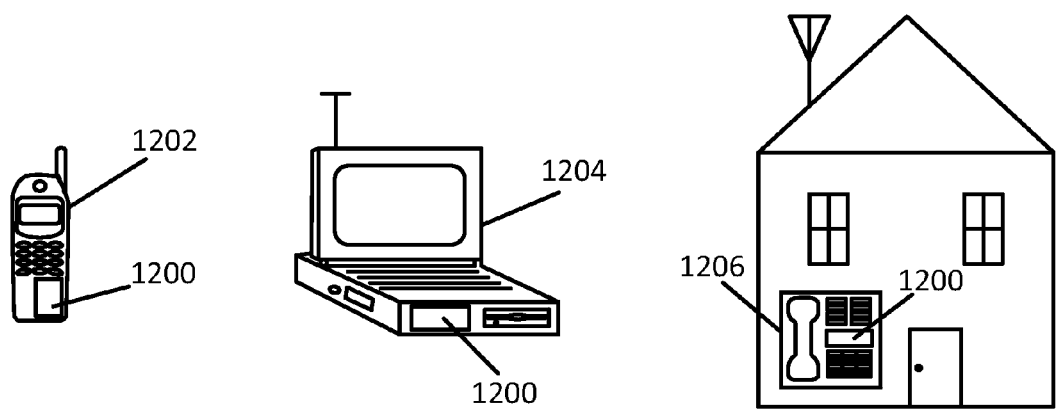
FIG. 12 illustrates various electronic devices that may integrate a semiconductor device, a die, an integrated circuit and/or PCB described herein.

FIG. 12 illustrates various electronic devices that may be integrated with any of the aforementioned semiconductor device, integrated circuit, die, interposer or package. For example, a mobile telephone 1202, a laptop computer 1204, and a fixed location terminal 1206 may include an integrated circuit (IC) 1200 as described herein. The IC 1200 may be, for example, any of the integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10A-10E, 11, and/or 12 may be rearranged and/or combined into a single component, step, feature or function or embodied in several components, steps, or functions. Additional elements, components, steps, and/or functions may also be added without departing from the invention. It should also be noted that FIGS. 2, 3, 4, 5, 6, 7, 8, 9, 10A-10E, 11, and/or 12 and its corresponding description in the present disclosure is not limited to dies and/or ICs. In some implementations, FIGS. 2, 3, 4, 5, 6, 7, 8, 9, 10A-10E, 11, and/or 12 and its corresponding description may be used to manufacture, create, provide, and/or produce semiconductor devices. In some implementations, a semiconductor device may include a die, a die package, an integrated circuit (IC), a wafer, and/or an interposer. In some implementations, the interposer may be an active interposer that includes circuit elements.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising:
   a substrate;
   a plurality of metal layers and a plurality of dielectric layers coupled to the substrate;
   a pad coupled to one of the plurality of metal layers;
   a first metal redistribution layer coupled to the pad; and
   a second metal redistribution layer coupled to the first metal redistribution layer, the second metal redistribution layer includes a cobalt tungsten phosphorous material.

2. The semiconductor device of claim 1, wherein the first metal redistribution layer is a copper layer.

3. The semiconductor device of claim 1, further comprising a first underbump metallization (UBM) layer and a second underbump metallization (UBM) layer.

4. The semiconductor device of claim 1, further comprising an adhesion layer between the first metal redistribution layer and the pad, the adhesion layer configured to couple the first metal redistribution layer to the pad.

5. The semiconductor device of claim 1, wherein the semiconductor device is one of at least a die, a die package, an integrated circuit (IC), a wafer, and/or an interposer.

6. The semiconductor device of claim 1, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

7. A semiconductor device comprising:
   a substrate;
   a plurality of metal layers and a plurality of dielectric layers coupled to the substrate;
   a pad coupled to one of the plurality of metal layers;
   a first metal redistribution layer coupled to the pad;
   a second metal redistribution layer coupled to the first metal redistribution layer; and
   a third metal redistribution layer coupled to the second metal redistribution layer;
   wherein at least one of the first metal redistribution layer, the second metal redistribution layer or the third metal redistribution layer includes a cobalt tungsten phosphorous material.

8. The semiconductor device of claim 7, wherein at least one of the first metal redistribution layer, the second metal redistribution layer or the third metal redistribution layer includes copper layer or a nickel layer.

9. The semiconductor device of claim 7 further comprising a first underbump metallization (UBM) layer and a second underbump metallization (UBM) layer.

10. The semiconductor device of claim 9, wherein the first UBM layer is a nickel layer, and the second UBM layer is a copper layer.

11. The semiconductor device of claim 7, further comprising an adhesion layer between the first metal redistribution layer and the pad, the adhesion layer configured to couple the first metal redistribution layer to the pad.

12. The semiconductor device of claim 7, wherein the semiconductor device is one of at least a die, a die package, an integrated circuit (IC), a wafer, and/or an interposer.

13. The semiconductor device of claim 7, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

14. A method for providing a semiconductor device, comprising:
    providing a substrate;
    providing a plurality of metal layers and a plurality of dielectric layers coupled to the substrate;
    providing a pad coupled to one of the plurality of metal layers;
    providing a first metal redistribution layer coupled to the pad; and
    providing a second metal redistribution layer coupled to the first metal redistribution layer, the second metal redistribution layer includes a cobalt tungsten phosphorous material.

15. The method of claim 14, wherein the first metal redistribution layer is a copper layer.

16. The method of claim 14, further comprising providing a first underbump metallization (UBM) layer and a second underbump metallization (UBM) layer.

17. The method of claim 14, further comprising providing an adhesion layer between the first metal redistribution layer and the pad, the adhesion layer configured to couple the first metal redistribution layer to the pad.

18. The method of claim 14, wherein the semiconductor device is one of at least a die, a die package, an integrated circuit (IC), a wafer, and/or an interposer.

19. The method of claim 14, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

20. A method for providing a semiconductor device, comprising:
   providing a substrate;
   providing a plurality of metal layers and a plurality of dielectric layers coupled to the substrate;
   providing a pad coupled to one of the plurality of metal layers;
   providing a first metal redistribution layer coupled to the pad;
   providing a second metal redistribution layer coupled to the first metal redistribution layer; and
   providing a third metal redistribution layer coupled to the second metal redistribution layer;
   wherein providing at least one of the first metal redistribution layer, the second metal redistribution layer or the third metal redistribution layer further includes providing a cobalt tungsten phosphorous material.

21. The method of claim 20, wherein at least one of the first metal redistribution layer, the second metal redistribution layer or the third redistribution layer is a copper layer or a nickel layer.

22. The method of claim 20 further comprising providing a first underbump metallization (UBM) layer and a second underbump metallization (UBM) layer.

23. The method of claim 22, wherein the first UBM layer is a nickel layer, and the second UBM layer is a copper layer.

24. The method of claim 20, further comprising providing an adhesion layer between the first metal redistribution layer and the pad, the adhesion layer configured to couple the first metal redistribution layer to the pad.

25. The method of claim 20, wherein the semiconductor device is one of at least a die, a die package, an integrated circuit (IC), a wafer, and/or an interposer.

26. The method of claim 20, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

27. The semiconductor device of claim 1, further comprising:
   a solder ball spaced apart from the pad and disposed directly on the second metal redistribution layer.

28. The semiconductor device of claim 1, wherein sidewalls of the first metal redistribution layer are devoid of the second metal redistribution layer.

29. The semiconductor device of claim 7, further comprising:
   a solder ball spaced apart from the pad and disposed directly on the cobalt tungsten phosphorous material.

30. The method of claim 14, further comprising:
   providing a solder ball spaced apart from the pad and disposed directly on the second metal redistribution layer.

31. The method of claim 14, wherein sidewalls of the first metal redistribution layer are devoid of the second metal redistribution layer.

32. The method of claim 20, further comprising:
   providing a solder ball spaced apart from the pad and disposed directly on the cobalt tungsten phosphorous material.

* * * * *